(12) United States Patent
Petit

(10) Patent No.: US 6,399,475 B1
(45) Date of Patent: Jun. 4, 2002

(54) PROCESS FOR PRODUCING ELECTRICAL CONNECTIONS ON THE SURFACE OF A SEMICONDUCTOR PACKAGE WITH ELECTRICAL-CONNECTION DROPS

(75) Inventor: Luc Petit, Fontaine (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/679,465

(22) Filed: Oct. 4, 2000

(30) Foreign Application Priority Data

Oct. 5, 2000 (FR) .............................. 99 12380

(51) Int. Cl.⁷ .................. H01L 21/44; H01L 23/48; H01L 25/52; B23K 35/14; B23K 31/00
(52) U.S. Cl. .................. 438/614; 438/610; 438/612; 257/738; 257/746; 257/779; 257/772; 228/179.1; 228/56.3
(58) Field of Search ............... 438/610, 612, 438/613, 614, 615; 257/738, 737, 746, 779, 780, 789; 228/178, 179.1, 180.1, 180.21, 56.3

(56) References Cited

U.S. PATENT DOCUMENTS

| | | | |
|---|---|---|---|
| 4,705,205 A | * 11/1987 | Allen et al. ............... | 228/180 |
| 4,985,310 A | 1/1991 | Agarwala et al. .......... | 428/620 |
| 5,377,899 A | * 1/1995 | Hashimoto ................ | 228/117 |
| 5,909,633 A | 6/1999 | Haji et al. ................. | 438/612 |
| 6,187,114 B1 | * 2/2001 | Ogashiwa ................. | 148/400 |
| 6,337,522 B1 | * 1/2002 | Kang et al. ............... | 257/784 |

FOREIGN PATENT DOCUMENTS

| | | |
|---|---|---|
| DE | 44 15 211 A1 | 12/1994 |
| EP | 0 164 906 | 12/1985 |
| FR | 2 722 916 | 1/1996 |
| WO | WO98/56217 | 12/1998 |

OTHER PUBLICATIONS

European Patent Abstract of Japanese Publication No. 05182973 filed on Jul. 23, 1993.
European Patent Abstract of Japanese Publication No. 10144721 filed on May 29, 1998.
European Patent Abstract of Japanese Publication No. 03291991 filed on Dec. 24, 1991.
Preliminary Search Report dated Jun. 16, 2000 for French Patent Application No. 99 12380.

* cited by examiner

*Primary Examiner*—John F. Niebling
*Assistant Examiner*—Thanhha Pham
(74) *Attorney, Agent, or Firm*—Lisa K. Jorgenson; Jon A. Gibbons; Fleit, Kain, Gibbons, Gutman & Bongini P.L.

(57) ABSTRACT

Process for producing electrical connections on the surface of a semiconductor package containing an integrated-circuit chip and having metal electrical-connection regions on the surface of the package, consisting of: covering these connection regions with a first metal layer forming an anti-diffusion barrier; covering this first layer with an anti-oxidation second metal layer; and depositing a metal solder drop or solder ball on the second metal layer. The solder drop comprises an addition of metal particles in suspension which contain at least one of the metals of the first metal layer so as to produce a precipitate comprising these additional metal particles and at least partly the metal of the second metal layer, the precipitate remaining in suspension in the solder drop.

7 Claims, 1 Drawing Sheet

PROCESS FOR PRODUCING ELECTRICAL CONNECTIONS ON THE SURFACE OF A SEMICONDUCTOR PACKAGE WITH ELECTRICAL-CONNECTION DROPS

CROSS-REFERENCE TO RELATED APPLICATIONS

This application is based upon and claims priority from prior French Patent Application No. 99-12380, filed Oct. 5, 1999, the entire disclosure of which is herein incorporated by reference.

BACKGROUND OF THE INVENTION

1. Field of the Invention

The present invention relates to the field of semiconductor packages containing an integrated-circuit chip and more particularly to the process of forming electrical connections on semiconductor packages with solder drops and solder balls.

2. Description of Related Art

Presently, semiconductor packages have, on the surface, metal electrical-connection regions or pads. These metal electrical-connection regions are generally made of copper and are covered with an anti-oxidation first metal layer. The first metal layer generally consisting of nickel (Ni) or cobalt (Co) or a nickel-cobalt alloy. A second metal layer generally made of gold (Au) or of palladium (Pd), is formed on top of the first metal layer. Along with the second metal layer, a metal solder drop or solder ball is formed.

The solder drop or solder ball is generally made of an alloy containing tin (Sn) combined with lead (Pb), silver (Ag) and/or copper (Cu). The first layer provides an anti-diffusion barrier in order to prevent direct contact between the copper layer and the solder drop. The solder drops are generally used to make an electrical connection with another circuit, for example a printed circuit.

Although these surface metal connection packages are useful, they are not without their problems. One problem is mechanical stress. When the packages are subjected to mechanical stresses or to cycles of temperature variations, or when the packages age, many times some of the solder drops become detached.

The problem of the solder drops becoming detached is due in part to the fact that, during the operation of soldering the solder drops to the connection regions, the metal constituting the second metal layer dissolves in the solder drop. This produces a tin-gold or tin-palladium precipitate. Over time, this precipitate migrates and reforms a layer on the first layer. This precipitate layer weakens and embrittles the connection or the interface between the solder drop and the first metal layer.

Accordingly, a need exists to overcome the above problems with the prior art and to provide a process and semiconductor package which reduces the embrittlement problem so as to limit the risk of the solder drops or balls de-bonding.

SUMMARY OF THE INVENTION

The present invention reduces the embrittlement phenomenon of the prior art so as to limit the risk of the solder drops or balls de-bonding.

The process for producing electrical connections on the surface of a semiconductor package containing an integrated-circuit chip and having metal electrical-connection regions on the surface of the package consists of: covering these metal electrical-connection regions with a first metal layer forming an anti-diffusion barrier; covering this first layer with an anti-oxidation second metal layer; and depositing a metal solder drop or solder ball on the second metal layer.

According to the invention, the solder drop comprises an addition of metal particles in suspension which contain at least one of the metals of the first metal layer, so as to produce a precipitate comprising these additional metal particles and at least partly the metal of the second metal layer the precipitate remaining in suspension in the solder drop.

According to one embodiment of the invention, the sum of the surface areas of the particles may be at least equal to half the area of contact between the solder drop and the connection region.

According to another embodiment of the invention, the sum of the volumes of the particles may be between 0.5 and 5 percent of the volume of the solder drop.

According to another embodiment of the invention, the first metal layer may advantageously comprise nickel (Ni) and/or cobalt (Co), the second metal layer may advantageously comprise gold (Au) or palladium (Pd) and the solder drop may advantageously comprise tin (Sn) and an addition of particles containing nickel (Ni) and/or cobalt (Co).

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF PREFERRED EMBODIMENTS

Figure 1:
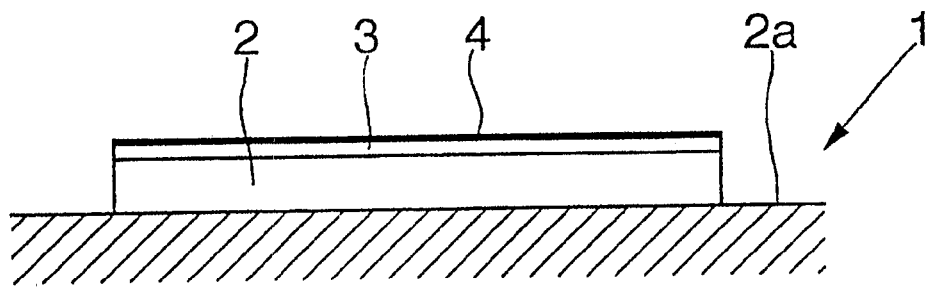
FIG. 1 shows a partial cross section through a package before the solder drop is deposited.
Figure 2:
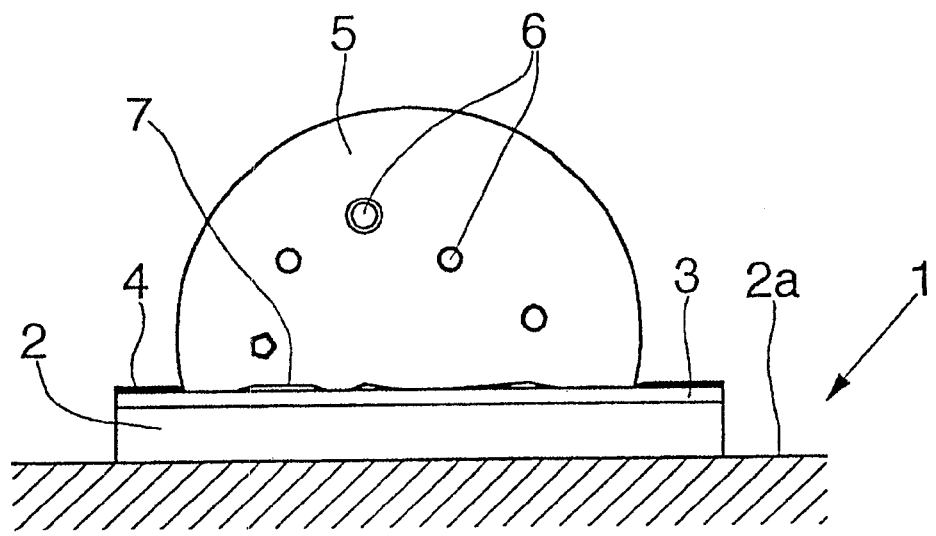
FIG. 2 shows the package of FIG. 1 after the solder drop has been soldered.

It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

Using a prefabricated semiconductor package 1, which contains an integrated-circuit chip (not shown) and which has a multiplicity of metal connection regions or pads 2 produced on its surface 2a so as to form an array of electrical connections connected to the integrated-circuit chip, each of the metal connection regions 2 is covered with a first metal layer 3 which forms an anti-diffusion barrier and this first layer 3 is covered with an anti-oxidation second metal layer 4, for example made of gold or palladium.

In practice the metal connection regions are generally made of copper (Cu). The anti-diffusion first metal layer 3 consists in general of nickel (Ni), cobalt (Co) or a nickel-cobalt (Ni-Co) mixture. The anti-oxidation second metal layer is in general composed of gold (Au) or palladium (Pd).

Next, a metal drop or metal ball 5 of tin-based solder, generally a tin-lead (Sn-Pb) alloy or a tin-lead-silver (Sn-Pb-Ag) alloy or a tin-copper (Sn-Cu) alloy or a tin-silver (Sn-Ag) alloy or a tin-silver-copper (Sn-Ag-Cu) alloy, is deposited on the second metal layer 4.

Furthermore, this metal solder drop 5 that is deposited contains, in suspension, an addition of particles, composed of at least one of the metals forming the first metal layer 3, namely nickel (Ni) particles or cobalt (Co) particles or nickel-cobalt (Ni-Co) particles.

When soldering the solder drop 5, the metal layer 4 of gold (Au) or palladium (Pd) diffuses or dissolves in the volume of the metal drop 5 and disappears.

During this diffusion the gold (Au) or the palladium (Pd) alloys with the tin (Sn) to produce tin-gold (Sn-Au) particles or tin-palladium (Sn-Pd) particles in suspension.

With the presence of the nickel particles 6, a nickel-tin-gold (Ni-Sn-Au) precipitate or a nickel-tin-palladium (Nri-Sn-Pd) precipitate is produced in suspension.

Thus, the nickel particles trap the gold or palladium particles within the mass of the drop 5.

Depending on the amount of nickel or cobalt particles 6 added, either the nickel or cobalt particles may trap all the gold or palladium of the second metal layer 4, leaving the tin-gold (Sn-Au) particles or the tin-palladium (Sn-Pd) particles to remain.

It should be noted that the nickel-tin-gold (Ni-Sn-Au) precipitate or the nickel-tin-palladium (Ni-Sn-Pd) precipitate is much more stable that the tin-gold (Sn-Au) particles or tin-palladium (Sn-Pd) particles.

When the package 1 is subsequently subjected to mechanical stresses or to cycles of temperature variations or while the package 1 ages, the nickel-tin-gold (Ni-Sn-Au) precipitate or the nickel-tin-palladium (Ni-Sn-Pd) precipitate will remain in suspension in the drop 5.

On the other hand, the tin-gold (Sn-Au) particles or the tin-palladium (Sn-Pd) particles, if they remain, will have a tendency to migrate towards the interface between the drop 5 and the first metal layer 3 and will form deposits 7. Nevertheless, these deposits 7 will be unable to cover the entire interface.

Thus, by virtue of the presence of nickel or cobalt particles in the metal solder drop 5 positioned, which trap the metal of the second metal layer 4, the attachment of the metal solder drop 5 to the first metal layer 3 is not weakened and the embrittlement is reduced.

The amount of nickel or cobalt particles 6 added to the solder drop 5 may be defined in various ways. In one embodiment, the sum of the surface areas of the particles 6 may be at least equal to half the area of contact between the solder drop 5 and the first metal layer 3. According to another example, the sum of the volumes of the particles 6 may be between 0.5 and 5 percent (%) of the volume of the solder drop 5.

While the invention has been illustrated and described in the preferred embodiments, many modifications and changes therein may be affected by those skilled in the art. It is to be understood that the invention is not limited to the precise construction herein disclosed. Accordingly, the right is reserved to all changes and modification coming within the true spirit and scope of the invention.

What is claimed is:

1. A process for producing electrical connections on the surface of a semiconductor package containing an integrated-circuit chip and having metal electrical-connection regions on the surface of the semiconductor package, the process comprising the steps of:

covering at least some of an electrical connection region on a semiconductor package with a first metal layer with one or more metals contained therein, so as to form an anti-diffusion barrier;

covering the first metal layer with an anti-oxidation second metal layer with one or metals contained therein; and depositing a metal solder drop on the second metal layer, wherein the metal solder drop comprises one or more additional metal particles in suspension which contain at least one of the metals of the first metal layer so as to produce a precipitate comprising these additional metal particles along with at least part of one of the metals of the second metal layer, the precipitate remaining in suspension in the metal solder drop.

2. The process according to claim 1, wherein the step of depositing the metal solder drop comprises one or more additional metal particles characterized in that each of the additional metal particles have a surface area and that a sum of the surface area of each of the metal particles is at least equal to half an area of contact defined between the metal solder drop and the electrical connection regions.

3. The process according to claim 1, wherein the step of depositing the metal solder drop comprises one or more additional metal particles characterized in that each of the additional metal particles has a volume and that a sum of the volume of each of the metal particles is between 0.5 and 5 percent of a volume of the metal solder drop.

4. The process according to claim 1, wherein the first metal layer comprises nickel (Ni) and/or cobalt (Co), and the metal solder drop comprises tin (Sn) and one or more additional metal particles containing nickel (Ni) and/or cobalt (Co).

5. The process according to claim 2, wherein the second metal layer comprises gold (Au) or palladium (Pd), and the metal solder drop comprises tin (Sn) and one or more additional metal particles containing nickel (Ni) and/or cobalt (Co).

6. The process according to claim 3, wherein the second metal layer comprises gold (Au) or palladium (Pd), and the metal solder drop comprises tin (Sn) and one or more additional metal particles containing nickel (Ni) and/or cobalt (Co).

7. A process for producing electrical connections on the surface of a semiconductor package containing an integrated-circuit chip and having metal electrical-connection regions on the surface of the package; the process comprising the steps of:

covering one or more connection regions with a first metal layer forming an anti-diffusion barrier;

covering the first layer with an anti-oxidation second metal layer; and depositing a metal solder drop on the second metal layer; wherein the metal solder drop comprises an addition of metal particles in suspension which contains at least one of the metals of the first metal layer so as to produce a precipitate comprising these additional metal particles and at least one of the metals of the second metal layer, the precipitate remaining in suspension in the solder drop.

* * * * *

UNITED STATES PATENT AND TRADEMARK OFFICE
CERTIFICATE OF CORRECTION

PATENT NO. : 6,399,475 B1
DATED : June 4, 2002
INVENTOR(S) : Luc Petit

It is certified that error appears in the above-identified patent and that said Letters Patent is hereby corrected as shown below:

<u>Title page,</u>
Item [30], Foreign Application Priority Data, please change "Oct. 5, 2000" to
-- Oct. 5, 1999 --.

Signed and Sealed this

Fifth Day of November, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

| | |
|---|---|
| PATENT NO. | : 6,399,475 B1 |
| APPLICATION NO. | : 09/679465 |
| DATED | : June 4, 2002 |
| INVENTOR(S) | : Luc Petit |

It is certified that error appears in the above-identified patent and that said Letters Patent is hereby corrected as shown below:

Column 4, Line 9: Please change "one or metals" to -- one or more metals --

Signed and Sealed this

Thirty-first Day of July, 2007

JON W. DUDAS
*Director of the United States Patent and Trademark Office*